US011683972B2

(12) United States Patent
Ju

(10) Patent No.: US 11,683,972 B2
(45) Date of Patent: Jun. 20, 2023

(54) EMITTING DEVICE MANUFACTURING METHOD USING LASER SHAVING AND MANUFACTURING EQUIPMENT FOR THE SAME

(71) Applicant: Kyonggi University Industry & Academia Cooperation Foundation, Gyeonggi-do (KR)

(72) Inventor: Sang Hyun Ju, Gyeonggi-do (KR)

(73) Assignee: Kyonggi University Industry & Academia Cooperation Foundation, Gyeonggi-do (KR)

( * ) Notice: Subject to any disclaimer, the term of this patent is extended or adjusted under 35 U.S.C. 154(b) by 67 days.

(21) Appl. No.: 17/161,506

(22) Filed: Jan. 28, 2021

(65) Prior Publication Data

US 2021/0234138 A1 Jul. 29, 2021

(30) Foreign Application Priority Data

Jan. 29, 2020 (KR) ........................ 10-2020-0010291
Jun. 16, 2020 (KR) ........................ 10-2020-0072796

(51) Int. Cl.

| | |
|---|---|
| ***H10K 71/20*** | (2023.01) |
| ***H10K 71/00*** | (2023.01) |
| ***H10K 59/35*** | (2023.01) |
| *H10K 50/11* | (2023.01) |
| *H10K 50/115* | (2023.01) |
| *H10K 102/00* | (2023.01) |

(52) U.S. Cl.

CPC ............. *H10K 71/00* (2023.02); *H10K 59/35* (2023.02); *H10K 71/231* (2023.02); *H10K 50/11* (2023.02); *H10K 50/115* (2023.02); *H10K 2102/351* (2023.02)

(58) Field of Classification Search

None

See application file for complete search history.

(56) References Cited

U.S. PATENT DOCUMENTS

2010/0117936 A1* 5/2010 Lhee ................... H01L 27/3211 345/76
2015/0044799 A1* 2/2015 Takeda ................ H01L 21/2686 438/33
2018/0083226 A1* 3/2018 Ichikawa ............ H01L 27/3244
2021/0139770 A1* 5/2021 Pousthomis .......... H01L 33/501
2021/0408180 A1* 12/2021 Hsu ..................... H01L 51/5092
2022/0149249 A1* 5/2022 Kubo .................... H01L 33/405

* cited by examiner

*Primary Examiner* — Michelle Mandala

(57) ABSTRACT

The present disclosure discloses a method for manufacturing a light-emitting device using laser etching including: a first light-emitting layer forming step for depositing a first light-emitting layer on an surface of a hole transport layer deposited on an upper surface of an anode substrate; a first light-emitting device forming step for etching the first light-emitting layer to form a first light-emitting device; a second light-emitting layer depositing step for depositing a second light-emitting layer on a region including the upper surface of the hole transport layer; a second light-emitting device forming step for etching the second light-emitting layer to form a second light-emitting device; a third light-emitting layer depositing step for depositing a third light-emitting layer on a region including the upper surface of the hole transport layer; and a third light-emitting device forming step for etching the third light-emitting layer to form a third light-emitting device.

15 Claims, 5 Drawing Sheets

START

FIRST LIGHT-EMITTING LAYER DEPOSITING STEP ~S110

FIRST LIGHT-EMITTING DEVICE FORMING STEP ~S120

SECOND LIGHT-EMITTING LAYER DEPOSITING STEP ~S130

SECOND LIGHT-EMITTING DEVICE FORMING STEP ~S140

THIRD LIGHT-EMITTING LAYER DEPOSITING STEP ~S150

THIRD LIGHT-EMITTING DEVICE FORMING STEP ~S160

LIGHT-EMITTING DEVICE ETCHING STEP ~S170

END

EMITTING DEVICE MANUFACTURING METHOD USING LASER SHAVING AND MANUFACTURING EQUIPMENT FOR THE SAME

CROSS-REFERENCE TO RELATED APPLICATION

This application claims priority of Korean Patent Application No. 10-2020-0010291, filed on Jan. 29, 2020, and priority of Korean Patent Application No. 10-2020-0072796, filed on Jun. 16, 2020, in the KIPO (Korean Intellectual Property Office), the disclosure of which is incorporated herein entirely by reference.

BACKGROUND OF THE INVENTION

Field of the Invention

The present disclosure relates to a method for manufacturing a light-emitting device constituting a flat display panel, and an apparatus for manufacturing the light-emitting device.

Description of the Related Art

A light-emitting device employed in a flat display panel includes an organic light-emitting diode (OLED) and a quantum dot light-emitting diode (QLED).

The organic light-emitting diode (OLED) is formed by sequentially stacking an anode electrode, a hole injection layer (HIL), a hole transport layer (HTL), a light-emitting layer (EML), an electron transport layer (ETL), an electron injection layer (EIL), and a cathode electrode. In addition, in the organic light-emitting diode, the light-emitting layer may form a red (R) light-emitting device, a green (G) light-emitting device, and a blue (B) light-emitting device to implement a color.

The R, G and B light-emitting devices are formed by depositing different types of organic materials, respectively. In general, the R, G and B light-emitting devices may be formed using a fine metal mask. The fine metal mask is a metal material plate thinner than a paper, and is an expendable key component for forming each of the R, G and B light-emitting devices. Numerous small device holes having a micrometer size are formed in the fine metal mask. The organic materials forming the R, G, and B light-emitting devices may be deposited on regions of a substrate on which the corresponding devices are to be formed, while passing through the device holes of the fine metal mask to form the R, G, and B devices.

The fine metal mask requires periodic cleaning since residual organic material is remained in the micrometer-sized device holes and a periphery thereof after a deposition process. In addition, the fine metal mask may be damaged or the device holes may be deformed during a deposition process or a cleaning process.

In addition, there are problems in that it is difficult to form the device hole of the fine metal mask to have a size of a micron or tens of nanometers or less, and it is difficult to apply the fine metal mask to a process for manufacturing a panel having ultra-high resolution.

The quantum dot light-emitting diodes (QLEDs) are formed as a light-emitting device including quantum dots. The quantum dot light-emitting diode may include a R light-emitting device, a G light-emitting device, and a B light-emitting device to implement color. Each of the R, G and B light-emitting devices may be formed by patterning each of layers including quantum dot particles having different sizes. However, a commercially available patterning technique capable of patterning the R, G and B light-emitting layer as light-emitting devices has not yet been developed.

The OLED that is currently commercially available can be patterned using the fine metal mask, but in the QLED, it is difficult to use the fine metal mask due to the difference in properties of material constituting the light-emitting layer. As a patterning method that has been developed so far for the R, G and B light-emitting layers, a physical patterning method such as a stamp method, a photoresist method, or an ink-jet printing method has been mainly used. However, in such the physical patterning method, phenomenon such as clogging of a mask/printer head/pen tip, staining, formation of a barrier, pattern downsizing, and the like occurs, which contributes to an increase in the process defect rate. In addition, the more elaborate and finer the light-emitting layer pattern is, the more frequently this phenomenon occurs, and thus this phenomenon acts as a major obstacle to an ultra-high resolution fine patterning technology. In addition, a chemical patterning method is a method employing a chemical reaction of quantum dot material, and utilizes the difference in chemical resistance of the quantum dot. However, the above-mentioned chemical patterning method can secure the uniformity of the patterned ultrafine quantum dot device, but has many difficulties such as deterioration of the quantum dot light-emitting characteristics and limitation of the available quantum dot materials.

The above-described information disclosed in the background description is provided only for improving the understanding of the background of the present disclosure, and thus may include the information which does not constitute the prior art.

SUMMARY OF THE INVENTION

An object of the present disclosure is to provide a method for manufacturing a light-emitting-device having ultra-high resolution using laser etching, and an apparatus for manufacturing this light-emitting device.

A method for manufacturing a light-emitting device using laser etching according to one embodiment of the present disclosure includes a first light-emitting layer depositing step for depositing a first light-emitting layer on an upper surface of a hole transport layer deposited on an upper surface of an anode substrate; a first light-emitting device forming step for etching the first light-emitting layer with a laser to form a first light-emitting device; a second light-emitting layer depositing step for depositing a second light-emitting layer on a region including the upper surface of the hole transport layer exposed at a periphery of the first light-emitting device; a second light-emitting device forming step for etching the second light-emitting layer with a laser to form a second light-emitting device; a third light-emitting layer depositing step for depositing a the light-emitting layer on a region including the upper surface of the hole transport layer exposed at peripheries of the first light-emitting device and the second light-emitting device; and a third light-emitting device forming step for etching the third light-emitting layer with a laser to form a third light-emitting device.

A method for manufacturing a light-emitting device using laser etching according to another embodiment of the present disclosure includes a first light-emitting layer coating step for coating an upper surface of an anode substrate with a first light-emitting layer; a first light-emitting device forming step for etching the first light-emitting layer with a laser to form a first light-emitting device; a second light-emitting layer coating step for coating a region including the upper surface of the anode substrate exposed at a periphery of the first light-emitting device with a second light-emitting layer; a second light-emitting device forming step for etching the second light-emitting layer with a laser to form a second light-emitting device; a third light-emitting layer coating step for coating a region including the upper surface of the anode substrate exposed at peripheries of the first light-emitting device and the second light-emitting device with a third light-emitting layer; and a third light-emitting device forming step for etching the third light-emitting layer with a laser to form a third second light-emitting device.

In addition, the present disclosure may further include a light-emitting device etching step for additionally etching upper surfaces of the first light-emitting device and the second light-emitting device with the laser after the third light-emitting device forming step.

Furthermore, in the present disclosure, in the light-emitting device etching step, an upper surface of third light-emitting device may also be etched with the laser after the third light-emitting device forming step.

In addition, in the present disclosure, the first light-emitting layer may be applied to have a thickness which is 1 to 20% greater than a thickness of the first light-emitting device, and the second light-emitting layer may be applied to have a thickness which is 1 to 20% greater than a thickness of the second light-emitting device. Also, in the present disclosure, the first light-emitting layer and the second light-emitting layer may be formed to have a thickness greater than that of the third light-emitting layer. In addition, in the present disclosure, the first light-emitting layer and the second light-emitting layer may be formed to have a thickness which is 1 to 20% greater than a thickness of the third light-emitting device.

In addition, the light-emitting device may be an organic light-emitting diode (OLED) or a quantum-dot light-emitting diode (QLED)

Furthermore, an apparatus for manufacturing a light-emitting device of the present disclosure is a manufacturing apparatus for applying the method for manufacturing a light-emitting device using laser etching, and includes a quantum dot material coating module configured to coat a substrate with a quantum dot material; a substrate cooling module disposed below a substrate support provided for mounting the substrate thereto and being configured to cool the substrate to a required temperature; a laser irradiation module configured to irradiate the laser; and a gas blowing module configured to blow an inert gas to a region on which the laser irradiates.

BRIEF DESCRIPTION OF THE DRAWINGS

The above and other features and advantages will become more apparent to those of ordinary skill in the art by describing in detail exemplary embodiments with reference to the attached drawings, in which.

In the following description, the same or similar elements are labeled with the same or similar reference numbers.

DETAILED DESCRIPTION

Figures 1, 2:
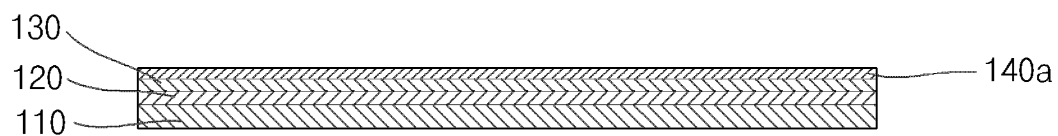
FIG. 1 is a flowchart of a method for manufacturing a light-emitting device using laser etching according to one embodiment of the present disclosure.
FIG. 2 is a view illustrating a process for a first light-emitting layer depositing step in the method for manufacturing a light-emitting device using laser etching according to one embodiment of the present disclosure.

Hereinafter, a preferred embodiment of the present disclosure will be elucidated in detail with reference to the accompanying drawings.

The embodiments of the present disclosure are provided for more completely explaining the present disclosure to those skilled in the art, the below embodiments can be modified to various forms and the scope of the present disclosure is not limited to the below embodiments. These embodiments are rather provided for more faithfully and completely explaining the present disclosure and for completely conveying the spirit of the present disclosure to those skilled in the art.

In the drawings, in addition, the dimension or thickness of each layer is exaggerated for clarity and convenience of the description and the same reference numeral indicates the same structural element. As used in the detail description, the term "and/or" includes any one of the listed items and one or more combination thereof. In addition, the term "connect" in the detail description means the state in which A member is directly connected to B member as well as the state in which C member disposed between A member and B member so that A member is indirectly connected to B member via C member.

The terms used herein are employed for describing the specific embodiment and the present disclosure is not limited thereto. As used in the detailed description and the appended claims, the singular forms may include the plural forms as well, unless the context clearly indicates otherwise. In addition, the terms "comprises" and/or "comprising" or "includes" and/or "including" used in the detailed description specify the presence of stated features, regions, integers, steps, operations, elements, and/or components, but do not preclude the presence or addition of one or more other features, regions, integers, steps, operations, elements, components, and/or groups thereof.

Although the terms of "first", "second", etc. are used herein to describe various members, parts, regions, layers and/or sections, it is obvious that these members, parts, regions, layers and/or sections should not be limited by the above terms. These terms are employed only for distinguishing one member, part, region, layer or section from another region, layer or section. Thus, the first member, the first part, the first region, the first layer or the first section described below may refer to the second member, the second part, the second region, the second layer or section without departing from the teachings of the present disclosure.

Furthermore, the terms related to a space such as "beneath", "below", "lower", "above" and "upper" may be used to easily understand one element or a characteristic or another element or a characteristic illustrated in the drawings. The above terms related to the space are employed for easy understanding of the present disclosure depending on various process states or usage states of the present disclosure, and are not intended to limit the present disclosure.

Hereinafter, a method for manufacturing a light-emitting device using laser etching and an apparatus for manufacturing the light-emitting device according to one embodiment of the present disclosure will be described with reference to the accompanying drawings.

First, a method for manufacturing a light-emitting device using laser etching according to one embodiment of the present disclosure is described.

Figure 3:
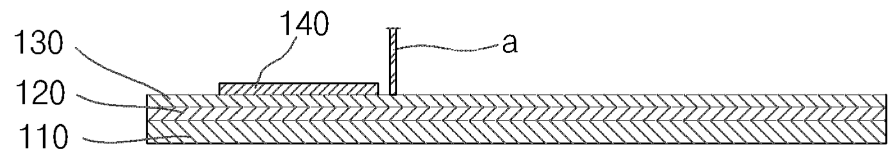
FIG. 3 is a view illustrating a process for a first light-emitting device forming step in the method for manufacturing a light-emitting device using laser etching according to one embodiment of the present disclosure.
Figure 4:
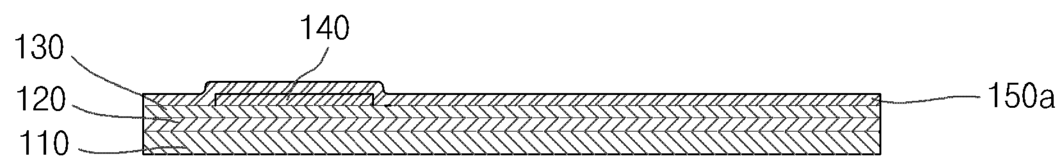
FIG. 4 is a view illustrating a process for a second light-emitting layer depositing step in the method for manufacturing a light-emitting device using laser etching according to one embodiment of the present disclosure.
Figure 5:
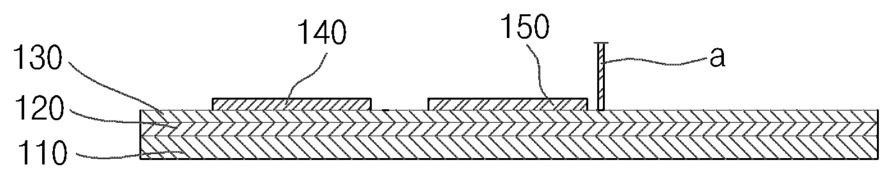
FIG. 5 is a view illustrating a process for a second light-emitting device forming step in the method for manufacturing a light-emitting device using laser etching according to one embodiment of the present disclosure.
Figure 6:
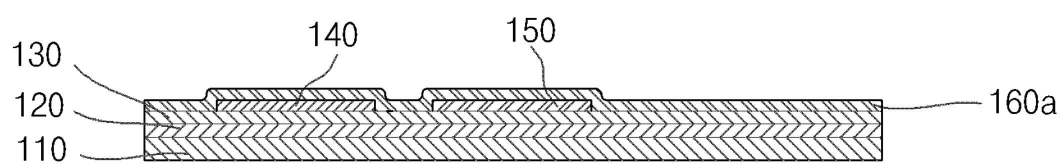
FIG. 6 is a view illustrating a process for a third light-emitting layer depositing step in the method for manufacturing a light-emitting device using laser etching according to one embodiment of the present disclosure.
Figure 7:
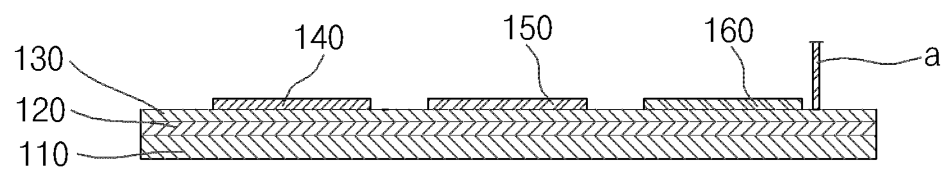
FIG. 7 is a view illustrating a process for a third light-emitting device forming step in the method for manufacturing a light-emitting device using laser etching according to one embodiment of the present disclosure.
Figure 8:
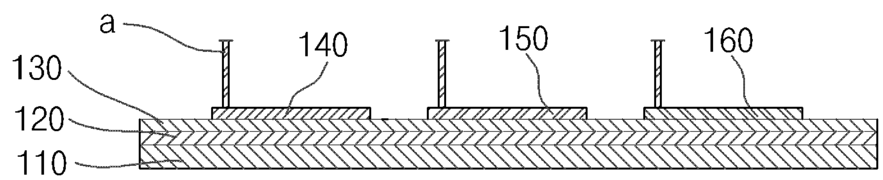
FIG. 8 is a view illustrating a process for a light-emitting device etching step in the method for manufacturing a light-emitting device using laser etching according to one embodiment of the present disclosure.
Figure 9:
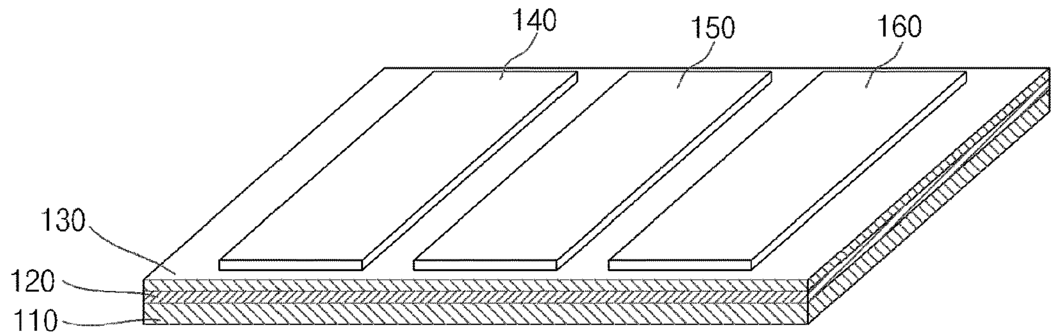
FIG. 9 is a partial perspective view of a light-emitting device manufactured by the method for manufacturing a light-emitting device using laser etching according to one embodiment of the present disclosure.

FIG. 1 is a flowchart of a method for manufacturing a light-emitting device using laser etching according to one embodiment of the present disclosure. FIG. 2 is a view illustrating a process for a first light-emitting layer depositing step in the method for manufacturing a light-emitting device using laser etching according to one embodiment of the present disclosure. FIG. 3 is a view illustrating a process for a first light-emitting device forming step in the method for manufacturing a light-emitting device using laser etching according to one embodiment of the present disclosure. FIG. 4 is a view illustrating a process for a second light-emitting layer depositing step in the method for manufacturing a light-emitting device using laser etching according to one embodiment of the present disclosure. FIG. 5 is a view illustrating a process for a second light-emitting device forming step in the method for manufacturing a light-emitting device using laser etching according to one embodiment of the present disclosure. FIG. 6 is a view illustrating a process for a third light-emitting layer depositing step in the method for manufacturing a light-emitting device using laser etching according to one embodiment of the present disclosure. FIG. 7 is a view illustrating a process for a third light-emitting device forming step in the method for manufacturing a light-emitting device using laser etching according to one embodiment of the present disclosure. FIG. 8 is a view illustrating a process for a light-emitting device etching step in the method for manufacturing a light-emitting device using laser etching according to one embodiment of the present disclosure. FIG. 9 is a partial perspective view of a light-emitting device manufactured by the method for manufacturing a light-emitting device using laser etching according to one embodiment of the present disclosure.

Referring to FIGS. 1 to 9, a method for manufacturing a light-emitting device using laser etching according to one embodiment of the present disclosure may include a first light-emitting layer depositing step S110, a first light-emitting device forming step S120, a second light-emitting layer depositing step S130, a second light-emitting device forming step S140, a third light-emitting layer depositing step S150, and a third light-emitting device forming step S160. In addition, the above method for manufacturing a light-emitting device using laser etching may further include a light-emitting device etching step S170.

The above method for manufacturing the light-emitting device using laser etching may manufacture an organic light-emitting diode (OLED) as a light-emitting device. That is, the light-emitting device may be OLED. Accordingly, the above method for manufacturing a light-emitting device using laser etching may be performed after a hole injection layer (HIL) and a hole transport layer (HTL) are formed on an anode substrate. In addition, after the method for manufacturing a light-emitting device using laser etching is performed, a process for forming the electron transport layer (ETL), a process for forming the electron injection layer (EIL), and a process for forming a cathode may be performed. A process for forming other layers constituting the organic light-emitting diode as the light-emitting device may be performed by a conventionally known process.

In addition, in the above, a set of the first light-emitting layer and the first light-emitting device may be one of a set of the R light-emitting layer and the R light-emitting device, a set of the G light-emitting layer and the G light-emitting device, and a set of the B light-emitting layer and the B light-emitting device, a set of the second light-emitting layer and the second light-emitting device may be another one of the above sets, and a set of the third light-emitting layer and the third light-emitting device is another one of the above sets, and the third light-emitting layer and the third light-emitting device may be the remaining one.

Hereinafter, on the assumption that the first light-emitting layer and the first light-emitting device are the R light-emitting layer and the R light-emitting device, the second light-emitting layer and the second light-emitting device are the G light-emitting layer and the G light-emitting device, and the third light-emitting layer and the third light-emitting device are the B light-emitting layer and the B light-emitting device, the present disclosure is described. In addition, in the following description, when it is not necessary to distinguish the first light-emitting layer, the second light-emitting layer and the third light-emitting layer, they may be referred to as light-emitting layers, and when there is no need to distinguish the first light-emitting device, the second light-emitting device and third light-emitting device, they may be referred to as light-emitting devices. The light-emitting layers may refer to layers that are sequentially applied, and the light-emitting devices may refer to thin films that are separated from each other by laser-etching the light-emitting layers and are thus individually formed.

The above method for manufacturing a light-emitting device using laser etching may be performed in an ultra-precise etching manner. In this ultra-precise etching manner, after an organic material for forming the first light-emitting layer is deposited on the entire region of the anode substrate on which the R, G and B light-emitting devices are to be formed, the first light-emitting layer in a region except for a region in which the first light-emitting device is to be formed is etched to form the first light-emitting device. Here, the above laser etching may mean a process for etching the light-emitting layer using a laser. In the method for manufacturing a light-emitting device using laser etching, a deposition and etching for the light-emitting layer are repeatedly performed for each of the R light-emitting device, the G light-emitting device, and the B light-emitting device. In addition, the light-emitting layer may be formed by depositing an organic material.

The method for manufacturing a light-emitting device using laser etching may implement a light-emitting device having ultra-high resolution through micro- or nano-sized laser etching. In the method for manufacturing a light-emitting device using laser etching, the light-emitting device may be formed by etching the light-emitting layer using a laser. Therefore, the light-emitting layer may be formed of the organic material having a characteristic by which a shape of an etched cross section thereof can be maintained while it is smoothly etched in a laser etching process. That is, the light-emitting layer may be formed of the optimal organic material for proper etching performed by a laser.

In addition, the hole transport layer positioned below the light-emitting layer may be formed of a material capable of minimizing damage thereto caused by laser etching. In the method for manufacturing a light-emitting device using laser etching, the light-emitting device may be formed by etching the light-emitting layer into an ultra-monolayer with a laser.

For precise etching of the light-emitting layer, in addition, a shape and size of a laser beam, an overlapped irradiation of the laser, power of the laser, a wavelength of the laser, a laser irradiation time, a scan rate of the laser, and a scan width of the laser may be controlled. For example, by controlling the intensity and irradiation time of the laser, the thickness and size of the light-emitting layer to be etched can be precisely adjusted on a nano scale. For example, in the method for manufacturing a light-emitting device using laser etching, the light-emitting layer may be formed to have a thickness of 10 nm or less, and the light-emitting layer may be uniformly etched through laser etching to have the thickness of 10 nm or less. In addition, the method for manufacturing a light-emitting device using laser etching may form a light-emitting device having a size of 8.5 μm or less.

Furthermore, in the method for manufacturing a light-emitting device using laser etching, when the hole transport layer is damaged in the process of etching the light-emitting layer, the hole transport layer may be re-deposited first and the light-emitting layer may be then formed.

In addition, the laser may irradiate the light-emitting layer in a vertical irradiation method using a telecentric lens or an array lens to accurately etch and pattern the light-emitting layer. Also, since the laser irradiates the light-emitting layer using the telecentric lens, the light-emitting device may be uniformly formed on the light-emitting layer over a large area. In addition, a vertical cavity surface emitting laser (VCSEL) may be employed as the above laser.

In addition, the laser may irradiate the light-emitting layer using the telecentric lens and a laser transmission control reticle. The laser transmission control reticle may control characteristics of a laser-transmissive surface and a laser-nontransmissive surface to precisely remove the light-emitting layer on a region except for a region in which the light-emitting device is to be formed. For example, the laser transmission control reticle may control the transmittances of the laser-transmissive surface and the laser-nontransmissive surface to remove the light-emitting layer, which is on a region except for a region in which the light-emitting device is to be formed, on a nano scale.

The laser transmission control reticle may impart hydrophobicity to a region including a region on which volatilized organic material is to be deposited. For example, the laser transmission control reticle may have a hydrophobic coating layer formed thereon. Accordingly, the laser transmission control reticle minimizes residual of the volatilized organic material and allows the stuck organic material to be easily removed.

In addition, the hole transport layer positioned below the light-emitting layer may be formed of a material capable of minimizing damage thereto caused by a laser irradiating during an etching process of the light-emitting layer.

Furthermore, the anode substrate may be formed of a material capable of minimizing damage thereto caused by a laser irradiating during the etching process of the light-emitting layer. Also, the anode substrate may be cooled to an appropriate temperature so that, during the etching process for the light-emitting layer, the light-emitting layer is smoothly etched and other layers are minimally affected. In addition, a cooling gas cooled to an appropriate temperature may be sprayed onto the upper surface of the light-emitting layer to cool the light-emitting layer, and the hole injection layer and the hole transport layer positioned below the light-emitting layer. In addition, the electron transport layer and the electron injection layer positioned above the light-emitting layer may also be cooled by a cooling gas. An inert gas may be used as the cooling gas. When the laser irradiates the light-emitting layer, it is possible to prevent deterioration occurring in the hole injection layer and the hole transport layer formed on the anode substrate in the periphery of an irradiation region.

In addition, an inert gas ($N_2$ gas, argon gas) may be blown to a region adjacent to the laser irradiation position in order to rapidly quickly remove fumes or vapors formed by volatilization of the light-emitting layer in the process of irradiating the laser and etching the light-emitting layer. In addition, the fume or vapor may be suctioned and then discharged to the outside. In this case, it is possible to minimize re-deposition of the volatilized organic material of the light-emitting layer to the hole transport layer or the light-emitting layer. On the other hand, when cooled and then sprayed, the blowing gas may perform a cooling action for the above-mentioned anode substrate or the hole injection layer and the hole transport layer together.

In addition, in the process of etching the light-emitting layer, the light-emitting layer may be etched to form the individual light-emitting devices, or may be etched in row and then etched to form individual light-emitting devices.

Referring to FIG. 2, the first light-emitting depositing step S110 is a step for depositing a first light-emitting layer 140*a* on an upper surface of a hole transport layer 130. The hole transport layer 130 may be formed on an anode substrate 110 and a hole injection layer 120. Here, the anode substrate 110 may have a configuration in which an anode electrode is formed on an upper surface of a base substrate, or the anode substrate 110 may be formed as an anode electrode. The base substrate may be a glass substrate or a flexible substrate. The first light-emitting layer 140*a* may be formed by depositing various organic materials which are generally used for forming a first light-emitting device 140. In the first light-emitting layer depositing step S110, various commonly used methods for depositing organic material may be applied. The hole transport layer 130 may be deposited on an upper surface of the hole injection layer 120 deposited on entire surface of the anode substrate 110.

Referring to FIG. 3, the first light-emitting device forming step S120 is a step for etching the first light-emitting layer 140*a* with a laser to form the first light-emitting device 140. In the first light-emitting device forming step S120, a laser irradiates a region of the first light-emitting layer 140*a* except for a region in which the first light-emitting device 140 is to be formed, so a region of the first light-emitting layer 140*a* except the first light-emitting device 140 may be etched. Accordingly, in the first light-emitting device forming step S120, the first light-emitting device 140 and the upper surface of the hole transport layer 130 except for a region in which the first light-emitting device 140 is formed may be exposed. The first light-emitting device 140 is formed in a region of the upper surface of the hole transport layer 130 on which the first light-emitting device 140 is to be formed.

In the first light-emitting device forming step S120, it is preferable to minimize damage to the hole transport layer 30 positioned below the first light-emitting layer 140*a* in the process of etching the first light-emitting layer 140*a*. Accordingly, in the first light-emitting device forming step S120, an etching thickness of the first light-emitting layer 140*a* may be controlled by using soft laser scanning in the process laser etching. In addition, the first light-emitting device forming step S120 may be performed while a temperature of the anode substrate 110 is controlled. For example, a temperature control means may be provided on a lower surface of the anode substrate 110 to heat or cool the anode substrate 110 to a required process temperature.

Referring to FIG. 4, the second light-emitting layer depositing step S130 is a step for depositing a second light-emitting layer 150*a* on the upper surface of the hole transport layer 130 exposed at a periphery of the first light-emitting device 140. In addition, in the second light-emitting layer depositing step S130, the second light-emitting layer 150*a* may also be deposited on an upper surface of the first light-emitting device 140. The second light-emitting layer 150*a* may be deposited with various organic materials which are conventionally used for forming a second light-emitting device 150. The second light-emitting layer depositing step S130 may be performed in the same manner as the first light-emitting layer depositing step S110.

Referring to FIG. 5, the second light-emitting device forming step S140 is a step for etching the second light-emitting layer 150*a* to form the second light-emitting device 150. In the second light-emitting device forming step S140, the second light-emitting layer 150*a* may be etched with a laser a. In the second light-emitting device forming step S140, all of the second light-emitting layer 150*a* deposited on the upper surface of the hole transport layer 130 in a region except for a region in which the second light-emitting device 150 is to be formed may be etched. In addition, in the second light-emitting device forming step S140, the second light-emitting layer 150*a* deposited on the upper surface of the first light-emitting device 140 may also be etched together with the second light-emitting layer deposited on the above region. In the second light-emitting device forming step S140, at this time, the second light-emitting layer 150*a* may be etched so that the upper surface of the first light-emitting device 140 is not damaged. In the second light-emitting device forming step S140, the first light-emitting device 140, the second light-emitting device 150 and the upper surface of the hole transport layer 130 except for the regions on which the first light-emitting device 140 and the second light-emitting device 150 are formed may be exposed.

Meanwhile, since the second light-emitting layer 150*a* is removed after being deposited on the upper surface of the first light-emitting device 140, it is preferable that the second light-emitting layer 150*a* is formed of a material having less reactivity with the material forming the first light-emitting layer 140*a*. In addition, it is preferable that the second light-emitting layer 150*a* is formed of a material that is easily separated from the material forming the first light-emitting layer 140*a*.

Referring to FIG. 6, the third light-emitting depositing step S150 is a step for depositing a third light-emitting layer 160*a* on the upper surface of the hole transport layer 130 exposed at peripheries of the first light-emitting device 140 and the second light-emitting device 150.

In the third light-emitting depositing step S150, in addition, the third light-emitting layer 160*a* may also be deposited on the upper surfaces of the first light-emitting device 140 and the second light-emitting device 150. The third light-emitting layer 160*a* may be deposited with various organic materials which are conventionally used for forming a third light-emitting device 160. The third light-emitting layer depositing step S150 may be performed in the same manner as the first light-emitting layer depositing step S110.

Referring to FIG. 7, the third light-emitting device forming step S160 is a step for etching the third light-emitting layer 160*a* to form the third light-emitting device 160. In the third light-emitting device forming step S160, the third light-emitting layer 160*a* may be etched with the laser a. In the third light-emitting device forming step S160, all of the third light-emitting layer 160*a* deposited on the upper surface of the hole transport layer 130 in a region except for a region in which the third light-emitting device 160 is to be formed may be etched. In addition, in the third light-emitting device forming step S160, the third light-emitting layer 160*a* deposited on the upper surfaces of the first light-emitting device 140 and the second light-emitting device 150 may also be etched together with the third light-emitting layer deposited on the above region. At this time, in the third light-emitting device forming step S160, the third light-emitting layer 160*a* may be etched so that the upper surfaces of the first light-emitting device 140 and the second light-emitting device 150 are not damaged. In the third light-emitting device forming step S160, the first light-emitting device 140, the second light-emitting device 150, the third light-emitting device 160 and the upper surface of the hole transport layer 130 except for the regions on which the first light-emitting device 140, the second light-emitting device 150 and the third light-emitting device 160 are formed may be exposed.

Therefore, after the third light-emitting device forming step S160, the first light-emitting device 140, the second light-emitting device 150, and the third light-emitting device 160 may be formed on the upper surface of the hole transport layer 130 in a state in which they are spaced apart from each other in a horizontal direction.

Referring to FIG. 8, the light-emitting device etching step S170 is a step for additionally etching the upper surfaces of the first light-emitting device 140 and the second light-emitting device 150 with the laser a. In addition, in the light-emitting device etching step S170, an upper surface of the third light-emitting device 160 may be additionally etched with a laser a. Since the second light-emitting layer 150*a* or the third light-emitting layer 160*a* is etched after deposited on the upper surfaces of the first light-emitting device 140 and the second light-emitting device 150 respectively, the organic material constituting the second light-emitting layer 150*a* or the third light-emitting layer 160*a* may be remained on the upper surfaces of the first light-emitting device 140 and the second light-emitting device 150. Accordingly, in the light-emitting device etching step S170, by additionally etching the upper surfaces of the first light-emitting device 140 and the second light-emitting device 150, it is possible to remove the organic material remained on the surface of each of the first and second light-emitting devices. In order to match thicknesses of the first, second and third light-emitting devices with each other, the third light-emitting device 160 may be etched to have the same height as those of the first light-emitting device 140 and the second light-emitting device 150. Accordingly, after the light-emitting device etching step S170, the first light-emitting device 140, the second light-emitting device 150, and the third light-emitting device 160 may be formed to have the same thickness.

In addition, the light-emitting device etching step S170 may be performed together with the third light-emitting device forming step S160 in which the third light-emitting layer 160*a* is etched to form the third light-emitting device 160. To this end, when the first light-emitting layer 140*a* is deposited, the first light-emitting layer 140*a* may be deposited to have a thickness greater than that of the final first light-emitting device 140. For example, the first light-emitting layer 140*a* may be deposited to have the thickness which is 1 to 20% greater than the final thickness of the first light-emitting device 140. Similarly, the second light-emitting layer 150*a* may also be deposited to have a thickness which is 1 to 20% greater than a final thickness of the second light-emitting device 150. In addition, the first light-emitting layer 140*a* and the second light-emitting layer 150*a* may be formed to have the thickness greater than that of the third light-emitting layer 160*a*. The first light-emitting layer 140*a* and the second light-emitting layer 150*a* may be formed to have the thickness which is 1 to 20% greater than that of the third light-emitting layer 160*a*.

In addition, in the process of etching the third light-emitting layer 160*a* to form the third light-emitting device 160, the first light-emitting device 140 and the second light-emitting device 150 may be over-etched to have the thickness which is the same as the requirable thickness of the first light-emitting device 140 and the second light-emitting device 150. In addition, the third light-emitting layer 160*a* may be formed to have the thickness corresponding to that of the third light-emitting device 160 in order to allow the third light-emitting layer 160*a* to be etched to be the same as the first light-emitting device 140 and the second light-emitting device 150. That is, the third light-emitting layer 160*a* may be deposited to have the same thickness as that of the third light-emitting device 160. In the process of etching the third light-emitting layer 160*a*, the third light-emitting layer may be etched as much as the thickness thereof and the increased thickness of the first light-emitting layer 140*a* and the second light-emitting layer 150*a*. In this case, the upper surfaces of the first light-emitting device 140 and the second light-emitting device 150 are over-etched, so no other organic material is remained on these upper surfaces.

For example, assuming that the final set thickness of the first light-emitting device 140, the second light-emitting device 150, and the third light-emitting device 160 is 300 nm, the first light-emitting layer 140*a* and the second light-emitting layer 150*a* may be formed to have the thickness of 310 nm. Accordingly, the first light-emitting device 140 and the second light-emitting device 150 may be formed first to have the thickness of 310 nm in the process of etching the first light-emitting layer 140*a* and the second light-emitting layer 150*a*. Next, after the third light-emitting layer 160*a* is deposited to have the thickness of 300 nm, it may be etched to have the thickness of 310 nm in the process of forming the third light-emitting device 160. In this case, the first light-emitting device 140 and the second light-emitting device 150 may be additionally etched by 10 nm to remove other organic materials remained on the upper surfaces thereof together. Finally, each of the first light-emitting device 140, the second light-emitting device 150, and the third light-emitting device 160 may be formed to have the thickness of 300 nm.

Meanwhile, since the third light-emitting layer 160*a* is removed after being deposited on the upper surfaces of the first light-emitting device 140 and the second light-emitting device 150, it is preferable the third light-emitting layer is formed of a material having less reactivity with a material forming the first light-emitting layer 140*a* and a material forming the second light-emitting layer 150*a*. In addition, it is preferable that the third light-emitting layer 160*a* is formed of a material that is easily separated from a material forming the first light-emitting layer 140*a* and the second light-emitting layer 150*a*.

The above description was made on the assumption that the first light-emitting device 140 is an R light-emitting device, the second light-emitting device 150 is a G light-emitting device, and the third light-emitting device 160 is a B light-emitting device. That is, since the first light-emitting device 140, the second light-emitting device 150, and the third light-emitting device 160 are sequentially formed, the R light-emitting device, the G light-emitting device, and the B light-emitting device may be sequentially formed.

In addition, the order in which the R light-emitting device, the G light-emitting device, and the B light-emitting device are formed may be changed. That is, the B light-emitting device may be formed first, and the R light-emitting device and the G light-emitting device may be then formed. Meanwhile, since the characteristics of the organic material forming the G light-emitting device are excellent and the characteristics of organic material forming the B light-emitting device is sensitive, the G light-emitting device may be formed first, and the R light-emitting device and the B light-emitting device may be sequentially formed. For example, when the organic material forming the G light-emitting device is etched well by a laser and the organic material forming the B light-emitting device is relatively hardly etched by the laser, the B light-emitting device may be formed last to minimize etching by the laser.

In addition, the method for manufacturing a light-emitting device using laser etching has been described as performing laser etching for forming the light-emitting device after forming the light-emitting layer. In addition to the above, in the method for manufacturing a light-emitting device using laser etching, laser etching may be performed after forming the light-emitting layer, the electron transport layer, and the electron injection layer. That is, in the process of forming the first light-emitting device 140, laser etching is performed after the first light-emitting layer 140*a*, the electron transport layer, and the electron injection layer are formed. At this time, in the process of laser etching, the first light-emitting layer 140*a*, the electron transport layer, and the electron injection layer in a region except for a region in which the first light-emitting device 140 is to be formed may be etched.

In addition, in the process of forming the second light-emitting device 150, laser etching may be performed after the second light-emitting layer 150*a*, the electron transport layer, and the electron injection layer are formed. At this time, in the process of laser etching, the second light-emitting layer 150*a*, the electron transport layer, and the electron injection layer in a region except for a region in which the second light-emitting device 150 is to be formed may be etched.

In addition, in the process of forming the third light-emitting device 160, laser etching may be performed after the third light-emitting layer 160*a*, the electron transport layer, and the electron injection layer are formed. At this time, in the process of laser etching, the third light-emitting layer 160*a*, the electron transport layer, and the electron injection layer in a region except for a region in which the third light-emitting device 160 is to be formed may be etched.

In addition, in the method for manufacturing a light-emitting device using laser etching, when the first light-emitting layer 140*a* is etched in the process of forming the first light-emitting device 140, the hole transport layer positioned therebelow may be etched together. In addition, when the second light-emitting layer 150*a* is deposited, the hole transport layer may be deposited first, and the second light-emitting layer 150*a* may be then formed. Furthermore, when the second light-emitting device 150 is formed, the second light-emitting layer 150*a* and the hole transport layer may be etched together. In addition, when the third light-emitting layer 160*a* is deposited, the hole transport layer may be deposited first, and the third light-emitting layer 160*a* may be then formed. When the third light-emitting device 160 is formed, it is possible to etch only the third light-emitting layer 160*a*. In this case, if the hole injection layer is damaged in the process of etching the light-emitting layer and the hole transport layer, the hole injection layer may be deposited again first.

In addition, in the method for manufacturing a light-emitting device using laser etching, when the first light-emitting layer 140*a* is etched in the process of forming the first light-emitting device 140, the hole transport layer and the hole injection layer positioned therebelow may be etched together. Furthermore, when the second light-emitting layer 150*a* is deposited, the hole transport layer and the hole injection layer may be deposited first, and the second light-emitting layer 150*a* may be then formed. In addition, when the second light-emitting device 150 is formed, the second light-emitting layer 150*a*, the hole transport layer, and the hole injection layer may be etched together. In addition, when the third light-emitting layer 160*a* is deposited, the hole transport layer and the hole injection layer may be deposited first, and the third light-emitting layer 160*a* may be then formed. When the third light-emitting device 160 is formed, it is possible to etch only the third light-emitting layer 160*a*.

The light-emitting device according to one embodiment of the present disclosure may be manufactured by the method for manufacturing the light-emitting device using laser etching. The light-emitting device may be an organic light-emitting diode (OLED). Accordingly, in the light-emitting device, traces representing that the first light-emitting device 140 and the second light-emitting device 150 was etched by the laser may be remained on the upper surfaces of the above devices. In addition, when the third light-emitting device 160 is etched as described above, the same etching trace may also be remained on the upper surface thereof. In general, since the first light-emitting device 140, the second light-emitting device 150, and the third light-emitting device 160 are formed by deposition, no etching trace is remained on the upper surfaces thereof.

In addition, etching traces formed by the laser may be remained on side surfaces of the first light-emitting device 140, the second light-emitting device 150, and the third light-emitting device 160. Furthermore, the first light-emitting device 140, the second light-emitting device 150, and the third light-emitting device 160 may have uniform size precision and spacing therebeween.

Referring to FIG. 9, in the light-emitting device according to one embodiment of the present disclosure, the first light-emitting device 140, the second light-emitting device 150, and the third light-emitting device 160 may be formed to form one pixel. In addition, in the OLED as the light-emitting device, pixels, each of which being formed by the first light-emitting device 140, the second light-emitting device 150, and the third light-emitting device 160, are arranged in a grid shape to form a flat display panel.

The apparatus for manufacturing a light-emitting device according to one embodiment of the present disclosure may be a manufacturing apparatus for applying a method for manufacturing a light-emitting device using laser etching. That is, the above apparatus for manufacturing a light-emitting device may be an apparatus for manufacturing an OLED. Accordingly, the above apparatus for manufacturing a light-emitting device may include a laser irradiation module, a substrate cooling module, and a gas blowing module together with a deposition module for depositing an organic material. The deposition module may be formed as a commonly used organic material deposition module.

The laser irradiation module may irradiate the laser for etching the light-emitting layer. Furthermore, the laser irradiation module may control a shape and size of the irradiating laser, an overlapped irradiation of the laser, power of the laser, a wavelength of the laser, a laser irradiation time, a scan rate of the laser, and a scan width of the laser.

In addition, the laser irradiation module may further include a telecentric lens or an array lens. In addition, the laser irradiation module may include a telecentric lens and a laser transmission control reticle.

The substrate cooling module may be disposed below a substrate support provided for mounting the substrate thereto, and may be configured to cool the substrate to a required temperature. The substrate cooling module may include a cooling channel formed in the substrate support or a cooling means disposed below the substrate support.

The gas blowing module may blow an inert gas into a region on which the laser irradiates. The gas blowing module may include a nozzle for spraying an inert gas and a gas pipe for supplying gas to the nozzle.

Next, a method for manufacturing a light-emitting device using laser etching according to another embodiment of the present disclosure is described.

Figure 10:
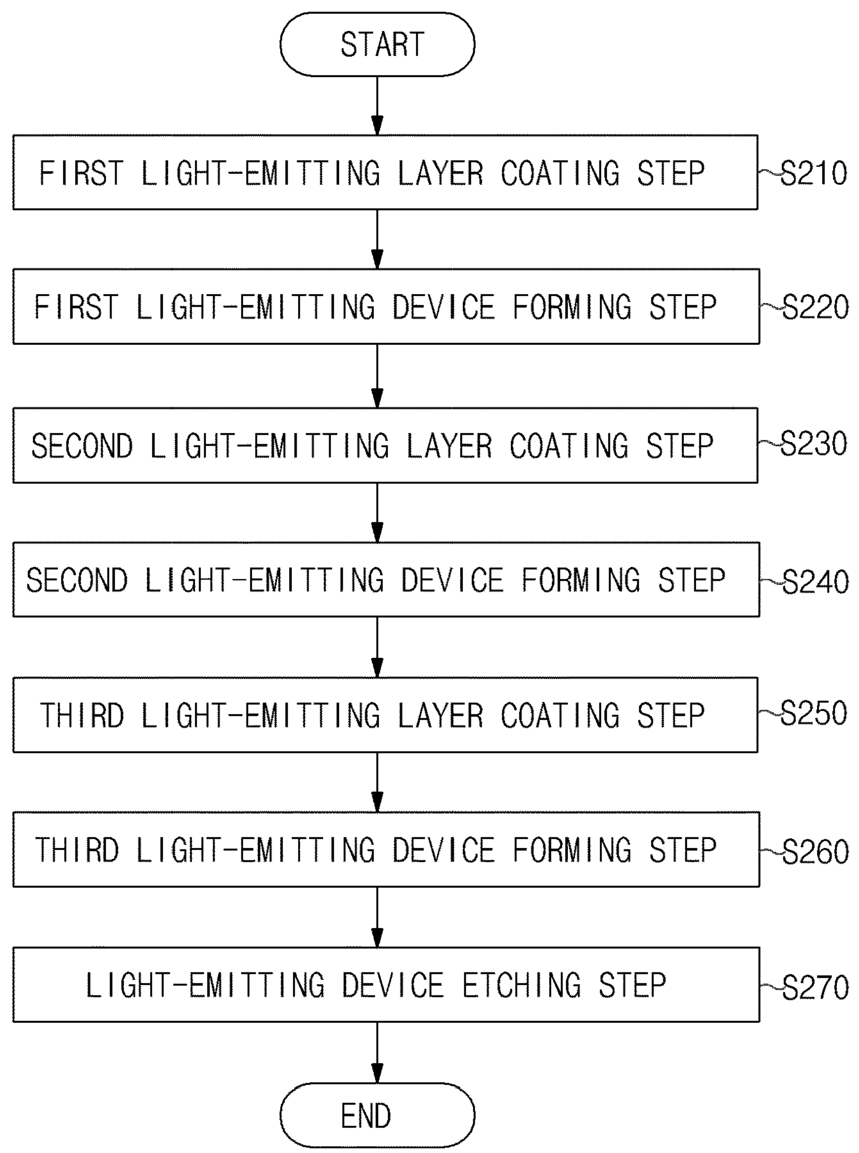
FIG. 10 is a flowchart of a method for manufacturing a light-emitting device using laser etching according to another embodiment of the present disclosure.
Figure 11:
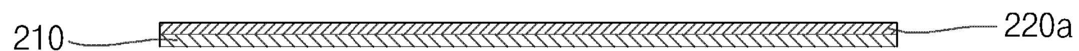
FIG. 11 is a view illustrating a process for a first light-emitting layer coating step in the method for manufacturing a light-emitting device using laser etching according to another embodiment of the present disclosure.
Figure 12:
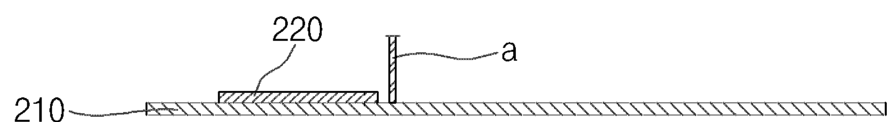
FIG. 12 is a view illustrating a process for a first light-emitting device forming step in the method for manufacturing a light-emitting device using laser etching according to another embodiment of the present disclosure.
Figure 13:
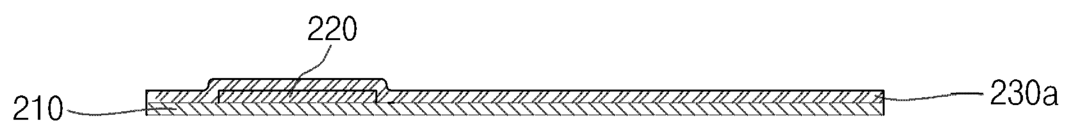
FIG. 13 is a view illustrating a process for a second light-emitting layer coating step in the method for manufacturing a light-emitting device using laser etching according to another embodiment of the present disclosure.
Figure 14:
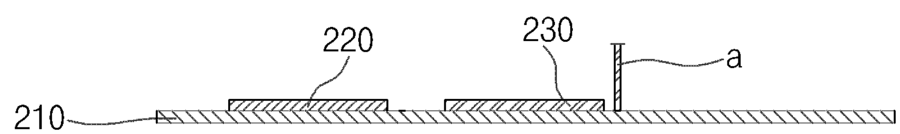
FIG. 14 is a view illustrating a process for a second light-emitting device forming step in the method for manufacturing a light-emitting device using laser etching according to another embodiment of the present disclosure.
Figure 15:
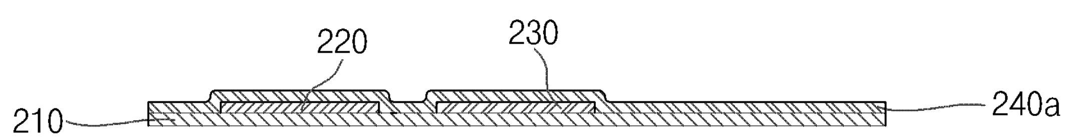
FIG. 15 is a view illustrating a process for a third light-emitting layer coating step in the method for manufacturing a light-emitting device using laser etching according to another embodiment of the present disclosure.
Figure 16:
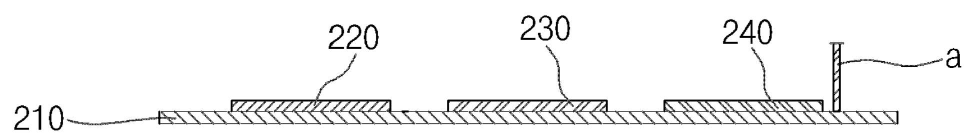
FIG. 16 is a view illustrating a process for a third light-emitting device forming step in the method for manufacturing a light-emitting device using laser etching according to another embodiment of the present disclosure.
Figure 17:
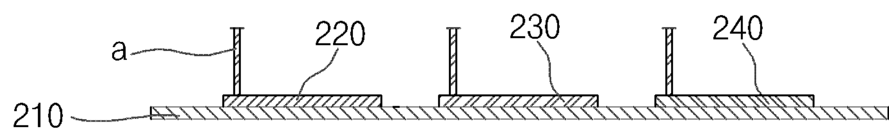
FIG. 17 is a view illustrating a process for a light-emitting device etching step in the method for manufacturing a light-emitting device using laser etching according to another embodiment of the present disclosure.
Figure 18:
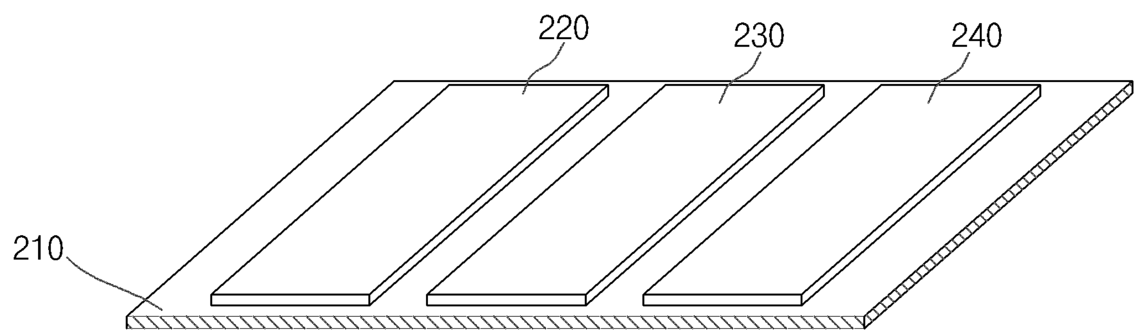
FIG. 18 is a partial perspective view of a light-emitting device manufactured by the method for manufacturing a light-emitting device using laser etching according to another embodiment of the present disclosure.

FIG. 10 is a flowchart of a method for manufacturing a light-emitting device using laser etching according to another embodiment of the present disclosure. FIG. 11 is a view illustrating a process for a first light-emitting layer coating step in the method for manufacturing a light-emitting device using laser etching according to another embodiment of the present disclosure. FIG. 12 is a view illustrating a process for a first light-emitting device forming step in the method for manufacturing a light-emitting device using laser etching according to another embodiment of the present disclosure. FIG. 13 is a view illustrating a process for a second light-emitting layer coating step in the method for manufacturing a light-emitting device using laser etching according to another embodiment of the present disclosure. FIG. 14 is a view illustrating a process for a second light-emitting device forming step in the method for manufacturing a light-emitting device using laser etching according to another embodiment of the present disclosure. FIG. 15 is a view illustrating a process for a third light-emitting layer coating step in the method for manufacturing a light-emitting device using laser etching according to another embodiment of the present disclosure. FIG. 16 is a view illustrating a process for a third light-emitting device forming step in the method for manufacturing a light-emitting device using laser etching according to another embodiment of the present disclosure. FIG. 17 is a view illustrating a process for a light-emitting device etching step in the method for manufacturing a light-emitting device using laser etching according to another embodiment of the present disclosure. FIG. 18 is a partial perspective view of a light-emitting device manufactured by the method for manufacturing a light-emitting device using laser etching according to another embodiment of the present disclosure.

The method for manufacturing a light-emitting device using laser etching according to another embodiment of the present disclosure may be equally applied to the same or similar configuration as compared with the method for manufacturing a light-emitting device using laser etching according to FIGS. 1 to 9, and the detail description thereon may be omitted below.

Referring to FIGS. 10 to 18, a method for manufacturing a light-emitting device using laser etching according to another embodiment of the present disclosure may include a first light-emitting layer coating step S210, a first light-emitting device forming step S220, a second light-emitting layer coating step S230, a second light-emitting device forming step S240, a third light-emitting layer coating step S250, and a third light-emitting device forming step S260. In addition, the above method for manufacturing a light-emitting device using laser etching may further include a light-emitting device etching step S270.

The method for manufacturing a light-emitting device using laser etching may manufacture a quantum dot light-emitting diode (QLED) as a light-emitting device. That is, the light-emitting device may be the QLED. The quantum dot light-emitting diode may be formed to have a general structure which has been conventionally known. For example, in the quantum dot light-emitting diode, R, G and B light-emitting devices are formed to be arranged on an upper face of an anode substrate in a grid shape, and an upper electrode may be formed on each of the upper surfaces of the R, G and B light-emitting devices. Here, the anode substrate may have a configuration in which an anode electrode is formed on an upper surface of a base substrate, or the anode substrate may be formed the anode electrode. In addition, the base substrate may be integrally formed with a lower electrode. In addition, in the quantum dot light-emitting diode, an additional layer may be formed between the base substrate and the lower electrode. In addition, in the quantum dot light-emitting diode, an additional layer for improving efficiency may be formed between the lower electrode and the light-emitting layer or between the light-emitting layer and the upper electrode. For example, the hole transport layer may be formed between the lower electrode and the light-emitting layer, and the electron transport layer may be formed between the light-emitting layer and the upper electrode.

The method for manufacturing a light-emitting device using laser etching is centered on a method for laser-etching and forming each of R, G, and B light-emitting devices in a quantum dot light-emitting diode. Accordingly, a process for forming the R, G and B light-emitting device using laser etching may be performed after the lower electrode is formed. A process for forming other layers constituting the quantum dot light-emitting diode may be performed by a conventional process known in the art.

The method for manufacturing a light-emitting device using laser etching may utilize a laser to etch a light-emitting layer, thereby forming a light-emitting device. Accordingly, the light-emitting layer may be formed of the quantum dot material having a characteristic by which a vertical shape of an etched cross section thereof can be maintained while it is smoothly etched in a laser etching process. That is, the light-emitting layer may be formed of the optimal quantum dot material for proper etching performed by a laser.

For precise etching of the light-emitting layer, in addition, a shape and size of a laser beam, an overlapped irradiation of the laser, power of the laser, a wavelength of the laser, a laser irradiation time, a scan rate of the laser, and a scan width of the laser may be controlled. For example, by controlling the intensity and irradiation time of the laser, the thickness and size of the light-emitting layer to be etched can be precisely adjusted on a nano scale. For example, in the method for manufacturing a light-emitting device using laser etching, the light-emitting layer may be formed to have a thickness of 500 nm or less, and the light-emitting layer may be uniformly etched through laser etching to have the thickness of 500 nm or less.

In addition, the anode substrate may be formed of a material capable of minimizing damage thereto caused by a laser irradiating during an etching process of the light-emitting layer. Also, the anode substrate may be cooled to an appropriate temperature so that, during the etching process for the light-emitting layer, the light-emitting layer is smoothly etched and other layers are minimally affected. In addition, it is possible to cool the light-emitting layer, which is being etched, by spraying a cooling gas cooled to an appropriate temperature to an upper surface of the light-emitting layer. An inert gas may be used as the cooling gas.

A conventional quantum dot material may be employed for a quantum dot material used for forming the first light-emitting layer, the second light-emitting layer and third light-emitting layer. The quantum dot material may include a quantum dot having a predetermined size, and a resin. In addition, the quantum dot material may further include solvent. The quantum dot materials used in the first light-emitting layer, the second light-emitting layer, and the third light-emitting layer may include quantum dots having different sizes. For example, the quantum dot of the first light-emitting layer may have a relatively large size, and the quantum dot of the second light-emitting layer and the quantum dot of the third light-emitting layer may have a relatively small size.

In addition, the quantum dot material may further include a light-absorbing material having a high absorption rate for a wavelength band of the laser used for etching the corresponding light-emitting layer. For example, when the first light-emitting layer is etched using a laser having a band of 355 nm, the quantum dot material may include the light-absorbing material that absorbs a relatively large amount of the laser having a band of 355 nm. Therefore, when the laser having a band of 355 nm irradiates the first light-emitting layer to etch this light-emitting layer, the first light-emitting layer may absorb more lasers due to action of the light-absorbing material, and be thus relatively heated further, thereby increasing etching efficiency. However, the appropriate amount of light-absorbing material may be mixed with the quantum dot material so as not to lower luminous efficiency of the quantum dot.

In addition, when the second light-emitting layer is etched using a laser having a band of 532 nm, the quantum dot material may include a light-absorbing material that absorbs a relatively large amount of the light having a band of 355 nm. Therefore, when the laser having a band of 532 nm irradiates the second light-emitting layer to etch this light-emitting layer, the second light-emitting layer may absorb more laser due to action of the light-absorbing material, and be thus relatively heated further, thereby increasing etching efficiency.

Furthermore, when the third light-emitting layer is etched using a laser having a band of 1,064 nm, the quantum dot material may include a light-absorbing material that absorbs a relatively large amount of the light having a band of 1,064 nm. Therefore, when the laser having a band of 1,064 nm irradiates the third light-emitting layer to etch this light-emitting layer, the third light-emitting layer may absorb more laser due to action of the light-absorbing material, and be thus relatively heated further, thereby increasing etching efficiency.

Referring FIG. 11, the first light-emitting coating step S210 is a step for coating an upper surface of an anode substrate 210 with a first light-emitting layer 220*a*. The first light-emitting layer 220*a* may be coated with various quantum dot materials which have been generally used to form a red(R) light-emitting device. The first light-emitting layer 220*a* may be formed by applying the quantum dot material. In the first light-emitting layer coating step S210, various coating methods which have been commonly used may be applied. For example, the first light-emitting layer coating step S210 may be performed in a dry process or a wet process. Here, the anode substrate 210 may have a configuration in which an anode electrode is formed on an upper surface of a base substrate or a structure, and may be formed as an anode electrode.

The first light-emitting layer coating step S210 may further include a process for curing the first light-emitting layer 220*a*. The first light-emitting layer 220*a* may be cured while being heated by irradiation of light. A laser used in the first light-emitting layer coating step S210 may be a laser having a wavelength different from that of a laser used to etch the first light-emitting layer described below. This can be applied equally to processes for coating the second light-emitting layer and the third light-emitting layers described below.

Referring to FIG. 12, the first light-emitting device forming step S220 is a step for etching the first light-emitting layer 220*a* to form a first light-emitting device 220. In the first light-emitting device forming step S220, the first light-emitting layer 220*a* may be etched with a laser a. In the first light-emitting device forming step S220, all of the first light-emitting layer 220*a* in a region except for a region in which the first light-emitting device 220 is to be formed may be etched. Etching the first light-emitting layer 220*a* may be performed using the laser having a wavelength band of 355 nm. At this time, the first light-emitting layer 220*a* may contain a light-absorbing material that absorbs a relatively large amount of light having a wavelength band of 355 nm. Accordingly, a temperature of the first light-emitting layer 220*a* is increased as a light absorption rate is increased in an etching region, so the first light-emitting layer may be etched more efficiently.

In the first light-emitting device forming step S220, the first light-emitting device 220 and an upper surface of the anode substrate 210 (or the hole transport layer) except for a region in which the first light-emitting device 220 is formed may be exposed. The first light-emitting device 220 is formed in a region of an upper surface of the anode substrate 210 on which the first light-emitting device 220 is to be formed. Here, the first light-emitting device 220 may be thus a R light-emitting device.

In the first light-emitting device forming step S220, it is necessary to minimize damage to the anode substrate 210 (or the hole transport layer) positioned below the first light-emitting layer 220*a* in the process of etching the first light-emitting layer 220*a*. Accordingly, in the first light-emitting device forming step S220, an etching thickness of the first light-emitting layer 220*a* may be controlled by using soft laser scanning in the process of laser etching. In addition, in the first light-emitting device forming step S220, it is possible to control a temperature of the anode substrate 210 is controlled. For example, a temperature control means may be provided on a lower surface of the anode substrate 210 to heat or cool the anode substrate 210 to a required process temperature.

Referring to FIG. 13, the second light-emitting layer coating step S230 is a step for coating the upper surface of the anode substrate (or the hole transport layer) exposed at a periphery of the first light-emitting device 220 with a second light-emitting layer 230*a*. The second light-emitting layer 230*a* may be formed by applying the quantum dot material. In the second light-emitting layer coating step S230, an upper surface of the first light-emitting device 220 may also be coated with the second light-emitting layer 230*a*. The second light-emitting layer 230*a* may be coated with various quantum dot materials which have been generally used to form the G light-emitting device. The second light-emitting layer coating step S230 may be performed in the same manner as the first light-emitting layer coating step S210.

The second light-emitting layer coating step S230 may further include a process for curing the second light-emitting layer 230*a*. The second light-emitting layer 230*a* may be cured while being heated by irradiation of light.

Referring to FIG. 14, the second light-emitting device forming step S240 is a step for etching the second light-emitting layer 230*a* to form a second light-emitting device 230. In the second light-emitting device forming step S240, the second light-emitting layer 250*a* may be etched with a laser a. In the second light-emitting device forming step S240, all of the second light-emitting layer 230*a* applied on an upper surface of the lower electrode in a region except for a region in which the second light-emitting device 230 is to be formed may be etched. In addition, in the second light-emitting device forming step S240, the second light-emitting layer 230*a* applied on the upper surface of the first light-emitting device 220 may be etched. At this time, in the second light-emitting device forming step S240, the second light-emitting layer 230*a* may be etched so that the upper surface of the first light-emitting device 220 is not damaged. Etching the second light-emitting layer 230*a* may be performed using the laser having a wavelength band of 532 nm. At this time, the second light-emitting layer 230*a* may contain a light-absorbing material that absorbs a relatively large amount of light having a wavelength band of 532 nm. Accordingly, a temperature of the second light-emitting layer 230*a* is increased as a light absorption rate is increased in an etching region, so the second light-emitting layer may be etched more efficiently.

In the second light-emitting device forming step S240, the first light-emitting device 220, the second light-emitting device 230 and the upper surface of the anode substrate 210 except for the regions on which the first light-emitting device 220 and the second light-emitting device 230 are formed may be exposed.

Meanwhile, since the second light-emitting layer 230*a* is removed after being applied on the upper surface of the first light-emitting device 220, it is preferable that the second light-emitting layer 230*a* is formed of a material having less reactivity with the material forming the first light-emitting layer 220*a*. In addition, it is preferable that the second light-emitting layer 230*a* is formed of a material that is easily separated from the material forming the first light-emitting layer 220*a*.

Referring to FIG. 15, the third light-emitting depositing step S250 is a step for coating the upper surface of the anode substrate 210 (or the hole transport layer) exposed at peripheries of the first light-emitting device 220 and the second light-emitting device 230 with a third light-emitting layer 240*a*. The third light-emitting layer 240*a* may be formed by applying a quantum dot material. Upper surfaces of the first light-emitting device 220 and the second light-emitting device 230 may also be coated with the third light-emitting layer 240*a*. The third light-emitting layer 240*a* may be coated with various quantum dot materials which are conventionally used for forming the B light-emitting device. The third light-emitting layer coating step S250 may be performed in the same manner as the first light-emitting layer coating step S210.

The third light-emitting layer coating step may further include a process for curing the third light-emitting layer 240*a*. The third light-emitting layer 240*a* may be cured while being heated by irradiation of light.

Referring to FIG. 16, the third light-emitting device forming step S260 is a step for etching the third light-emitting layer 240*a* to form a third light-emitting device. In the third light-emitting device forming step S260, the third light-emitting layer 240*a* may be etched with the laser a. In the third light-emitting device forming step S260, all of the third light-emitting layer 240*a* applied on the upper surface of the anode substrate 210 in a region except for a region in which the third light-emitting device 240 is to be formed may be etched. In addition, in the third light-emitting device forming step S260, the third light-emitting layer 240*a* applied on the upper surfaces of the first light-emitting device 220 and the second light-emitting device 230 may be etched. At this time, in the third light-emitting device forming step S260, the third light-emitting layer 240*a* may be etched so that the upper surfaces of the first light-emitting device 220 and the second light-emitting device 230 are not damaged. Etching the third light-emitting layer 240*a* may be performed using the laser having a wavelength band of 1,064 nm. At this time, the first third light-emitting layer 240*a* may contain a light-absorbing material that absorbs a relatively large amount of light having a wavelength band of 1,064 nm. Accordingly, a temperature of the third light-emitting layer 240*a* is increased as a light absorption rate is increased in an etching region, so the third light-emitting layer may be etched more efficiently.

In the third light-emitting device forming step S260, the first light-emitting device 220, the second light-emitting device 230, the third light-emitting device 240 and the upper surface of the anode substrate 210 except for the regions on which the first light-emitting device 220, the second light-emitting device 230 and the third light-emitting device 240 are formed may be exposed.

Therefore, after the third light-emitting device forming step S260, the first light-emitting device 220, the second light-emitting device 230, and the third light-emitting device 240 may be formed on the upper surface of the anode substrate 210.

Referring to FIG. 17, the light-emitting device etching step S270 is a step for additionally etching the upper surfaces of the first light-emitting device 220 and the second light-emitting device 230 with the laser a. In the light-emitting device etching step S270, an upper surface of the third light-emitting device 240 may be additionally etched with the laser a. Since the second light-emitting layer 230*a* or the third light-emitting layer 240*a* is etched after being applied on the upper surfaces of the first light-emitting device 220 and the second light-emitting device 230 respectively, the quantum dot material constituting the second light-emitting layer 230*a* or the third light-emitting layer 240*a* may be remained on the upper surfaces of the first light-emitting device 220 and the second light-emitting device 230. Accordingly, in the light-emitting device etching step S270, by additionally etching the upper surfaces of the first light-emitting device 220 and the second light-emitting device 230, it is possible to remove the quantum dot material remained on the surface of each of the first and second light-emitting devices. In order to match thicknesses of the first, second and third light-emitting devices with each other, the third light-emitting device 240 may be etched to have the same height as those of the first light-emitting device 220 and the second light-emitting device 230. Accordingly, after the light-emitting device etching step S270, the first light-emitting device 220, the second light-emitting device 230, and the third light-emitting device 240 may be formed to have the same thickness.

In addition, the light-emitting device etching step S270 may be performed together with a process for etching the third light-emitting layer 240*a* to form the third light-emitting device 240. To this end, when the first light-emitting layer 220*a* is applied, the first light-emitting layer 220*a* may be applied to have a thickness greater than that of the final first light-emitting device 220. For example, the first light-emitting layer 220*a* may be applied to have the thickness which is 1 to 20% greater than the thickness of the first light-emitting device 220. Similarly, the second light-emitting layer 230*a* may also be applied to have the thickness which is 1 to 20% greater than the thickness of the second light-emitting device 230. In addition, the first light-emitting layer 220*a* and the second light-emitting layer 230*a* may be formed to have the thickness greater than that of the third light-emitting layer 240*a*. The first light-emitting layer 220*a* and the second light-emitting layer 230*a* may be formed to have the thickness which is 1 to 20% greater than that of the third light-emitting layer 240*a*.

In addition, in the process of etching the third light-emitting layer 240*a* to form the third light-emitting device 340, the first light-emitting device 220 and the second light-emitting device 230 may be over-etched to have the thickness which is the same as the requirable thickness of the first light-emitting device 220 and the second light-emitting device 230. In addition, the third light-emitting layer 240*a* may be formed to have the thickness corresponding to that of the third light-emitting device 240 in order to allow the third light-emitting layer 240*a* to be etched to be the same as the first light-emitting device 220 and the second light-emitting device 230. That is, the third light-emitting layer 240*a* may be applied to have the thickness which is the same as that of the third light-emitting device 240. In the process of etching the third light-emitting layer 240*a*, the third light-emitting layer may be etched as much as the thickness thereof and the increased thickness of the first light-emitting layer 220*a* and the second light-emitting layer 230*a*. In this case, the upper surfaces of the first light-emitting device 220 and the second light-emitting device 230 are over-etched, so no other quantum dot material is remained on these upper surfaces.

For example, assuming that the final set thickness of the first light-emitting device 220, the second light-emitting device 230, and the third light-emitting device 240 is 300 nm, the first light-emitting layer 220*a* and the second light-emitting layer 230*a* may be formed to have the thickness of 310 nm. Accordingly, the first light-emitting device 220 and the second light-emitting device 230 may be formed first to have the thickness of 310 nm in the process of etching the first light-emitting layer 220*a* and the second light-emitting layer 230*a*. Next, after the third light-emitting layer 240*a* is applied to have the thickness of 300 nm, it may be etched to have the thickness of 310 nm in the process of forming the third light-emitting device 240. In this case, the first light-emitting device 220 and the second light-emitting device 230 may be additionally etched by 10 nm to remove other quantum dot organic materials remained on the upper surfaces thereof together. Finally, each of the first light-emitting device 220, the second light-emitting device 230, and the third light-emitting device 240 may be formed to have the thickness of 300 nm.

Meanwhile, since the third light-emitting layer 240*a* is removed after being applied on the upper surfaces of the first light-emitting device 220 and the second light-emitting device 230, it is preferable the third light-emitting layer is formed of a material having less reactivity with a material forming the first light-emitting layer 220*a* and a material forming the second light-emitting layer 230*a*. In addition, it is preferable that the third light-emitting layer 240*a* is formed of a material that is easily separated from a material forming the first light-emitting layer 220*a* and the second light-emitting layer 230*a*.

The above description was made on the assumption that the first light-emitting device 220 is an R light-emitting device, the second light-emitting device 230 is a G light-emitting device, and the third light-emitting device 240 is a B light-emitting device. That is, since the first light-emitting device 220, the second light-emitting device 230, and the third light-emitting device 240 are sequentially formed, the R light-emitting device, the G light-emitting device, and the B light-emitting device may be sequentially formed.

In addition, the order in which the R light-emitting device, the G light-emitting device, and the B light-emitting device are formed may be changed. That is, the B light-emitting device may be formed first, and the R light-emitting device and the G light-emitting device may be then formed.

On the other hand, when the electron transport layer is formed between the anode substrate 210 and the light-emitting layers 220*a*, 230*a*, 240*a* and the electron injection layer is formed between the light-emitting layers 220*a*, 230*a*, 240*a* and the upper electrode, the process may be performed as below.

For example, in the method for manufacturing a light-emitting device using laser etching, after forming the electron transport layer and the electron injection layer on the upper surface of the anode substrate 210, the light-emitting layers 220*a*, 230*a*, and 240*a* may be formed and laser etching may be performed. That is, in the process of forming the first light-emitting device 220, laser etching is performed after the first light-emitting layer 220*a*, the electron transport layer, and the electron injection layer are formed. At this time, in the process of laser etching, the first light-emitting layer 220*a*, the electron transport layer, and the electron injection layer in a region except for a region in which the first light-emitting device 220 is to be formed may be etched.

In addition, in the process of forming the second light-emitting device 230, laser etching may be performed after the second light-emitting layer 230*a*, the electron transport layer, and the electron injection layer are formed. At this time, in the process of laser etching, the second light-emitting layer 230*a*, the electron transport layer, and the electron injection layer in a region except for a region in which the second light-emitting device 230 is to be formed may be etched.

In addition, in the process of forming the third light-emitting device 240, laser etching may be performed after the third light-emitting layer 240*a*, the electron transport layer, and the electron injection layer are formed. At this time, in the process of laser etching, the third light-emitting layer 240*a*, the electron transport layer, and the electron injection layer in a region except for a region in which the third light-emitting device 240 is to be formed may be etched.

In addition, in the method for manufacturing a light-emitting device using laser etching, when the first light-emitting layer 220*a* is etched in the process of forming the first light-emitting device 220, the hole transport layer positioned therebelow may be etched together. In addition, when the second light-emitting layer 230*a* is applied, the hole transport layer may be applied first, and the second light-emitting layer 230*a* may be then formed. Furthermore, when the second light-emitting device 230 is formed, the second light-emitting layer 230*a* and the hole transport layer may be etched together. In addition, when the third light-emitting layer 240*a* is applied, the hole transport layer may be applied first, and the third light-emitting layer 240*a* may be then formed. When the third light-emitting device 240 is formed, it is possible to etch only the third light-emitting layer 240*a*. In this case, if the hole injection layer is damaged in the process of etching the third light-emitting layer 240*a* and the hole transport layer, the hole injection layer may be applied again first.

In addition, in the method for manufacturing a light-emitting device using laser etching, when the first light-emitting layer 220*a* is etched in the process of forming the first light-emitting device 220, the hole transport layer and the hole injection layer positioned therebelow may be etched together. Furthermore, when the second light-emitting layer 230*a* is applied, the hole transport layer and the hole injection layer may be applied first, and the second light-emitting layer 230*a* may be then formed. In addition, when the second light-emitting device 230 is formed, the second light-emitting layer 230*a*, the hole transport layer, and the hole injection layer may be etched together. Furthermore, when the third light-emitting layer 240*a* is applied, the hole transport layer and the hole injection layer may be applied first, and the third light-emitting layer 240*a* may be then formed. When the third light-emitting device 240 is formed, it is possible to etch only the third light-emitting layer.

The light-emitting device according to another embodiment of the present disclosure may be manufactured by a method for manufacturing a light-emitting device using laser etching.

Accordingly, in the light-emitting device, traces representing that the first light-emitting device and the second light-emitting device was etched by the laser may be remained on the upper surfaces of the above devices. In addition, when the third light-emitting device is etched as described above, the same etching trace may also be remained on the upper surface thereof. In general, since the first light-emitting device, the second light-emitting device, and the third light-emitting device are formed by applying the material, no etching trace is remained on the upper surfaces thereof.

In addition, etching traces formed by the laser may be remained on side surfaces of the first light-emitting device, the second light-emitting device, and the third light-emitting device. Furthermore, the first light-emitting device, the second light-emitting device, and the third light-emitting device may have uniform size precision and spacing therebetween.

Referring to FIG. 18, in the light-emitting device according to another embodiment of the present disclosure, the first light-emitting device 220, the second light-emitting device 230, and the third light-emitting device 240 may be formed to constitute one pixel. In addition, in the above light-emitting device, pixels, each of which being formed by the first light-emitting device 220, the second light-emitting device 230, and the third light-emitting device 240, are arranged in a grid shape to form a flat display panel.

The apparatus for manufacturing a light-emitting device according to another embodiment of the present disclosure may be a manufacturing apparatus for applying a method for manufacturing a light-emitting device using laser etching. Accordingly, the above apparatus for manufacturing a light-emitting device may include a laser irradiation module, a substrate cooling module, and a gas blowing module together with a coating module for applying a quantum dot material.

The coating module may be configured as a coating module for commonly used quantum dot material. For example, the coating module may be formed as a dry coating module or a wet coating module.

The laser irradiation module may irradiate a laser for etching the light-emitting layer. Furthermore, the laser irradiation module may control a shape and size of the irradiating laser, an overlapped irradiation of the laser, power of the laser, a wavelength of the laser, a laser irradiation time, a scan rate of the laser, and a scan width of the laser.

In addition, the laser irradiation module may further include a telecentric lens or an array lens. Also, the laser irradiation module may include a vertical cavity surface emitting laser (VCSEL). In addition, the laser irradiation module may include a telecentric lens and a laser transmission control reticle.

The substrate cooling module is disposed below a substrate support provided for mounting the substrate thereto, and may be configured to cool the substrate to a required temperature. The substrate cooling module may include a cooling channel formed in the substrate support or a cooling means disposed below the substrate support.

The gas blowing module may blow an inert gas to a region on which the laser irradiates. The gas blowing module may include a nozzle for spraying an inert gas and a gas pipe for supplying a gas to the nozzle.

While the present disclosure has been described with reference to the embodiments illustrated in the figures, the embodiments are merely examples, and it will be understood by those skilled in the art that various changes in form and other embodiments equivalent thereto can be performed. Therefore, the technical scope of the disclosure is defined by the technical idea of the appended claims.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method for manufacturing a light-emitting device using laser etching, the method comprising:

a first light-emitting layer depositing step for depositing a first light-emitting layer on an upper surface of a hole transport layer deposited on an upper surface of an anode substrate;

a first light-emitting device forming step for etching the first light-emitting layer with a laser to form a first light-emitting device;

a second light-emitting layer depositing step for depositing a second light-emitting layer on a region including the upper surface of the hole transport layer exposed at a periphery of the first light-emitting device;

a second light-emitting device forming step for etching the second light-emitting layer with a laser to form a second light-emitting device;

a third light-emitting layer depositing step for depositing a third light-emitting layer on a region including the upper surface of the hole transport layer exposed at peripheries of the first light-emitting device and the second light-emitting device;

a third light-emitting device forming step for etching the third light-emitting layer with a laser to form a third light-emitting device; and a light-emitting device etching step for additionally etching upper surfaces of the first light-emitting device and the second light-emitting device with the laser after the third light-emitting device forming step so that the first light-emitting device and the second light-emitting device have the same thickness as the third light-emitting device.

2. The method for manufacturing a light-emitting device using laser etching of claim 1, wherein, in the light-emitting device etching step, an upper surface of third light-emitting device is also etched with the laser after the third light-emitting device forming step.

3. The method for manufacturing a light-emitting device using laser etching of claim 2, wherein the first light-emitting layer is deposited to have a thickness which is 1 to 20% greater than a thickness of the first light-emitting device, and the second light-emitting layer is deposited to have a thickness which is 1 to 20% greater than a thickness of the second light-emitting device.

4. The method for manufacturing a light-emitting device using laser etching of claim 2, wherein the first light-emitting layer and the second light-emitting layer are formed to have a thickness greater than that of the third light-emitting layer.

5. The method for manufacturing a light-emitting device using laser etching of claim 2, wherein the first light-emitting layer and the second light-emitting layer are formed to have a thickness which is 1 to 20% greater than a thickness of the third light-emitting device.

6. The method for manufacturing a light-emitting device using laser etching of claim 1, wherein the light-emitting device is an organic light-emitting diode (OLED).

7. A method for manufacturing a light-emitting device using laser etching, the method comprising:

a first light-emitting layer coating step for coating an upper surface of an anode substrate with a first light-emitting layer;

a first light-emitting device forming step for etching the first light-emitting layer with a laser to form a first light-emitting device;

a second light-emitting layer coating step for coating a region including the upper surface of the anode substrate exposed at a periphery of the first light-emitting device with a second light-emitting layer;

a second light-emitting device forming step for etching the second light-emitting layer with a laser to form a second light-emitting device;

a third light-emitting layer coating step for coating a region including the upper surface of the anode substrate exposed at peripheries of the first light-emitting device and the second light-emitting device with a third light-emitting layer;

a third light-emitting device forming step for etching the third light-emitting layer with a laser to form a third second light-emitting device; and a light-emitting device etching step for additionally etching upper surfaces of the first light-emitting device and the second light-emitting device with the laser after the third light-emitting device forming step so that the first light-emitting device and the second light-emitting device have the same thickness as the third light-emitting device.

8. The method for manufacturing a light-emitting device using laser etching of claim 7, wherein, in the light-emitting device etching step, an upper surface of third light-emitting device is also etched with the laser after the third light-emitting device forming step.

9. The method for manufacturing a light-emitting device using laser etching of claim 7, wherein the first light-emitting layer is applied to have a thickness which is 1 to 20% greater than a thickness of the first light-emitting device, and the second light-emitting layer is applied to have a thickness which is 1 to 20% greater than a thickness of the second light-emitting device.

10. The method for manufacturing a light-emitting device using laser etching of claim 7, wherein the first light-emitting layer and the second light-emitting layer are formed to have a thickness greater than that of the third light-emitting layer.

11. The method for manufacturing a light-emitting device using laser etching of claim 7, wherein the first light-emitting layer and the second light-emitting layer are formed to have a thickness which is 1 to 20% greater than a thickness of the third light-emitting device.

12. The method for manufacturing a light-emitting device using laser etching of claim 7, wherein the first light-emitting device forming step, the second light-emitting device forming step, and the third light-emitting device forming step are performed while the substrate is cooled or a cooling gas is sprayed to an upper surface of the light-emitting layer.

13. The method for manufacturing a light-emitting device using laser etching of claim 7, being performed while an inert gas is blown to a region on which the laser irradiates.

14. The method for manufacturing a light-emitting device using laser etching of claim 7, wherein the laser irradiates the light-emitting layer through a telecentric lens or an array lens.

15. The method for manufacturing a light-emitting device using laser etching of claim 7, wherein the light-emitting device is a QLED.

* * * * *